United States Patent
Zarrineh et al.

(10) Patent No.: US 6,813,201 B2
(45) Date of Patent: Nov. 2, 2004

(54) AUTOMATIC GENERATION AND VALIDATION OF MEMORY TEST MODELS

(75) Inventors: Kamran Zarrineh, Nashua, NH (US); Thomas A. Ziaja, Austin, TX (US); Amitava Majumdar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 202 days.

(21) Appl. No.: 10/039,498

(22) Filed: Oct. 24, 2001

(65) Prior Publication Data

US 2003/0076723 A1 Apr. 24, 2003

(51) Int. Cl.$^7$ .............................................. G11C 7/00
(52) U.S. Cl. .................................. 365/201; 365/189.07
(58) Field of Search ............................ 365/201, 189.07

(56) References Cited

U.S. PATENT DOCUMENTS

| | | | | |
|---|---|---|---|---|
| 5,978,260 A | * | 11/1999 | Trimberger et al. | 365/182 |
| 6,148,277 A | * | 11/2000 | Asava et al. | 703/22 |
| 6,216,252 B1 | * | 4/2001 | Dangelo et al. | 716/1 |
| 6,285,974 B1 | * | 9/2001 | Mandyam et al. | 703/13 |

OTHER PUBLICATIONS

Ziaja, Tom et al., "Array Modeling For Test and Verfication." *IEEE 9$^{th}$ NATW*, pp.: 25–31.

* cited by examiner

Primary Examiner—Richard Elms
Assistant Examiner—Tuan T. Nguyen
(74) Attorney, Agent, or Firm—Lahive & Cockfield, LLP (57) ABSTRACT

Methods and systems for automated memory test modeling generation and validation are provided. Information supplied by a graphical user interface is used to generate a customized memory primitive. The memory primitive subsequently undergoes a two phase validation to test for correct functioning.

28 Claims, 7 Drawing Sheets

| | |
|---|---|
| 1 | module <memory_name> |
| | /* where <memory_name> is the RT-level name of the memory; */ |
| 2 | CLASS = {REGISTER FILE, SRAM, DRAM]; |
| 3 | FUNCTION = {RAM, CAM, FIFO}; |
| 4 | WIDTH = <integer>; |
| | /* where integer indicates the data width of the memory. */ |
| 5 | DEPTH = <integer>; |
| | /* where integer indicates the address depth of the memory. */ |
| 6 | MIN_ADDRESS = <integer>; |
| 7 | MAX_ADDRESS = <integer>; |
| | /* The minimum and maximum addressable locations for read and write ports. */ |
| 8 | READ_ADDRESS = {decoded, encoded}; |
| 9 | WRITE_ADDRESS = {decoded, encoded}; |
| | /* Fully decoded and encoded address signals. */ |
| 10 | PORTS = {R=<integers>,W=<integer>,RW=<integer>,C=<integer>,S, R}; |
| | /* Where R: read only ports, W: write only ports, RW: read and write ports, */ |
| | /* C: compare ports, S: set port, R: reset port */ |
| 11 | WRITE_POLARITIES={$WD^{polarity}, WA^{polarity}, WE^{polarity}, WCLK^{polarity}$}; |
| | /* polarity ={+, -} */ |
| | /* WD+ \| WD- : write data acts as an A \| B phase latch */ |
| | /* WA+ \| WA- : write address acts as an A \| B phase latch */ |
| | /* WE+ \| WE- : write enable acts as an A \| B phase latch */ |
| | /* WCLK+ \| WCLK- : actual write occurs on the rising/falling edge */ |
| 12 | READ_POLARITIES={$RD^{polarity}, RA^{polarity}, RE^{polarity}, RCLK^{polarity}$}; |
| | /* polarity ={+, -} */ |
| | /*RD+ \| RD- : read data acts as an A \| B phase latch */ |
| | /* RA+ \| RA- : read address acts as an A \| B phase latch */ |
| | /* RE+ \| RE- : read enable acts as an A \| B phase latch */ |
| | /* RCLK+ \| RCLK- : read occurs on the rising/falling edge */ |
| 13 | RR_RESOLUTION={R, X}; |
| | /* where R : indicates that the location could be read */ |
| 14 | WW_RESOLUTION={true, false}; |
| | /* where true: indicates that two ports can write to the same location */ |
| 15 | PORT_ARBITRATION={port names}; |
| | /* The order the port names appear in the list determines the dominant ports. */ |
| 16 | RW_RESOLUTION={NW, XW, OW, XX, OX}; |
| | /* where NW: reading new data and writing the data */ |
| | /* XW: reading X and writing the data */ |
| | /* OW: reading old data and writing data */ |
| | /* XX: reading and writing Xs */ |
| | /* OX: reading old data and writing X */ |
| 17 | endmodule; |

AUTOMATIC GENERATION AND VALIDATION OF MEMORY TEST MODELS

TECHNICAL FIELD

The present invention relates generally to digital circuits, and specifically relates to memory testing.

BACKGROUND OF THE INVENTION

An application specific integrated circuit (ASIC) is a semiconductor chip that is produced for a customer using a design process substantially different from that used to produce custom semiconductor chips. ASICs can be designed using a suite of computer aided design (CAD) programs. Each ASIC is simulated to predict its performance under worst-case production tolerances. These simulations are used to ensure performance of the production chips. Simulations can be performed by carrying out experiments that utilize a digital computer representation of the system using data structures and programs.

For designing ASICs, several levels of modeling may be used. The levels are identified by the type of primitive components used. The primitive components of a particular model are those that cannot be structurally decomposed or divided into other recognizable components. Primitive components can be combined to form more complex components for a particular model. The primitives may be gates, or transistors, for example. In a transistor-level model, the primitives are transistors, and, at such a level, gates are functional (or high level) combinations of transistor primitives. On the other hand, at a gate-level description, the primitives are gates and the concept of transistors combined into gates does not apply.

For a typical ASIC design, three levels of modeling are utilized: the register transfer (RT)-level, the gate-level and the transistor-level. The RT-level provides a behavioral description of the design possibly including gate behavioral descriptions. The gate-level provides a Boolean representation of the design, as well as a representation of structural characteristics of the design. The transistor-level provides the most detailed electrical description of the design of the three levels and is used to ultimately create the layout of the ASIC.

The RT-level model is used to define the intended behavioral functioning of an ASIC design and the transistor-level model is used to create the manufacturing template or layout. ASIC design usually begins with an RT-level description. Once the intended functioning of the RT-level design is verified, its gate-level, and ultimately transistor-level, models are created through synthesis and technology mapping of the RT-level design.

For custom semiconductor chip designs, the RT-level and transistor-level models are developed separately, for most of the design, and are intended to model the same function. To verify that the RT-level and transistor-level models are equivalent, the transistor-level model is translated into a gate-level model through model abstraction and the RT-level is translated into another gate-level model through a synthesis process where the design is mapped into a technology library consisting of gate representations. The two gate-level models are then checked to ensure that they represent the same Boolean function by application of test patterns, or other methods. Because they are verified equivalent, the RT-level model is then used for simulation while the transistor-level model is used as a template to create the manufacturing layout.

Unfortunately, behavioral descriptions of embedded memories in an RT-level model cannot be efficiently (or correctly) synthesized into a gate-level model, nor can a transistor-level model of an embedded memory be processed using abstraction algorithms into a gate-level model. Consequently, transformations from the RT-level and the transistor-level description of embedded memories to the equivalent gate-level description must be done by hand. Such hand generation of the gate-level description is time-consuming, error-prone, and potentially costly. Furthermore, even if successfully generated, a gate-level embedded memory model is too complex for use as a memory test model. Test patterns can be created with an automatic test generation program (ATPG), by hand, or derived from functional programming code. ATPG uses the test models, including the memory test model, as the basis for generation of test patterns. The ATPG program can require its own set of primitives, typically for latches and memories among others.

Figure 1:
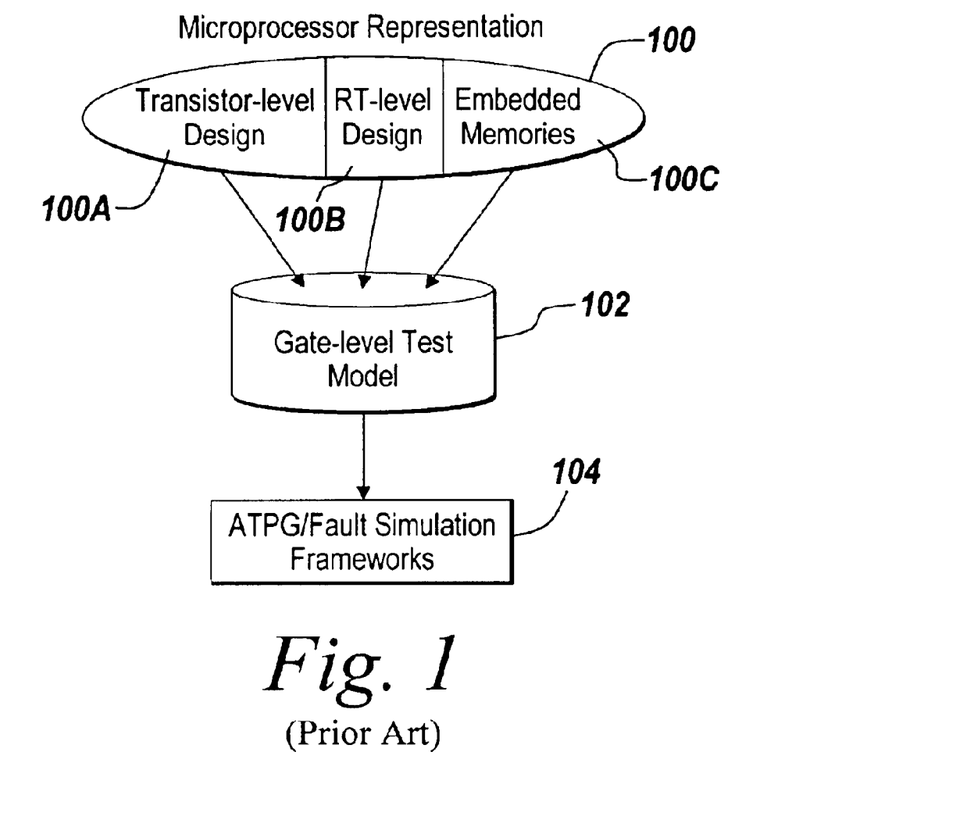
FIG. 1 depicts a conventional approach to designing and testing a microprocessor design.

FIG. 1 shows a schematic for memory model generation using a conventional technique. The example in FIG. 1 relates to an integrated circuit such as, but not limited to, a microprocessor that includes an embedded memory, which requires a gate-level description. In the absence of an automated process, the gate-level description is created by hand. The microprocessor representation 100 includes a transistor-level design 100A, an RT-level design 100B, and a hand generated representation of the embedded memories 100C, as described above. The microprocessor representation 100 yields a gate-level test model 102, which can then lead to a test generation and fault simulation framework 104. The process of generating test patterns for digital designs and validating their effectiveness is integrated in the design methodology. An automatic test pattern generation and fault simulation framework 104, also referred to as a test framework, imports the gate-level test model 102 description of a design. In some instances, the RT-level design may be input into the gate-level test model 102 directly instead of the typical route using synthesis.

From a test perspective, that is using an ATPG program, an embedded memory can be understood with the transistor-level, RT-level or gate-level models. At one extreme, the detailed behavior of an embedded memory can be described so that within the test framework all the internal details of the memory are specified; at the other extreme, the memory could be treated as a module with unknown behavior, i.e., as an empty module. These memory test models are referred to as white box and black box test models, respectively. For the logic external to the memory, the non-memory logic, a gate-level representation of a design can be produced through synthesis or model abstraction. However, because synthesis and model abstraction is not efficient for embedded memories, the gate-level description of the memory itself is typically generated manually.

A white-box model of a memory, as described above, is a structure that includes, but is not limited to, all the components typical to a memory, such as a set of n×m memory cells, one or more write head(s), one or more sense amplifier(s) and possibly one or more address decoder(s); the components of a typical memory as listed form a structure which is referred to as a memory block. The boundary of the memory block in the RT-level model of a design is critical for implementing an automated memory test model generation process, and should match the boundary of the memory in the transistor-level model of the design. A memory is a structure that contains a memory block and possibly some random logic between the inputs and outputs (I/Os) of the memory block and any scannable storage elements or an I/O feeding such a scannable storage element. A memory array refers to the n×m array of memory cells in the memory block.

The memory block is modeled using either a structural or a memory primitive model. In the structural model, functions such as an address decoder, a write head and a sense amplifier are described in terms of random logic, which refers to combinational (e.g., AND or OR gates) and sequential (e.g., flops or latches) logic. Random logic excludes memory components such as random access memory (RAM). In this model, the memory cells are described in terms of flip-flops and latches. The structural model can be generated from a behavioral description of a memory model if the behavior of each component of the memory is described in sufficient detail. One of the drawbacks of the structural model is its large gate-level model size and complexity, which results in high test generation and fault simulation run times.

The memory-primitive model is an alternative to the structural model. Since many test generation/fault simulation frameworks provide a set of memory primitives as a part of their library, it is advantageous to use those primitives instead of modeling the memory block structurally. In the memory primitive model, the contents of the embedded memory's memory block are depicted as an indivisible RAM entity or primitive. The memory primitive model includes the same behavior as the structural model, since both models place an equivalent boundary around the embedded memory block. A memory that is not modeled using either a structural or a memory primitive model is treated as if it has essentially no information content and is a black box model. The white box model of a memory, whether modeled with the structural or the memory primitive model, is then combined with the logic external to the embedded memory block to form a model of the memory.

When embedded memories are registered, so that the exact boundary of the memory block is buffered with scannable flops/latches, and are tested with on-chip test engines, such as Memory Built In Self Test, it might be possible to use a black block model of the memory. However, a typical microprocessor contains memories with different physical and timing characteristics and registering the exact boundary of the memory is not always feasible due to timing constraints of the design. Also, not all memories are good candidates to be tested via MBIST. Therefore, a white box model is necessary to model this class of the embedded memories for test. This often means manually generating the white box model for the embedded memories. There are several disadvantages to the prevalent manual memory test model generation approach for custom designs. For example, changes in RT-level description of the memories are rarely reflected in memory test models. Also, any minor changes in either the circuit or RT-level design results in repeating the memory test model generation and validation process. Another disadvantage is the possible loss of information from the designing stage to the test engineering stage, which can result in inaccurate memory block test models. Additionally, an incorrect boundary at the memory block results in an inaccurate test model of the chip.

SUMMARY OF THE INVENTION

Provided herein is a system for automatically generating and validating a memory test model for an electronic device. The system includes a memory test model generator for inputting memory characteristics for the electronic device and for outputting a memory primitive, as well as a memory test model validator for validating the memory primitive for generating a memory test model for the electronic device.

The memory test model generator can include a graphical user interface for inputting the memory characteristics, and a memory model maker for selecting a template for the memory primitive and for utilizing the memory characteristics, which can be input using memory description language, to customize the memory primitive. A portion of the memory characteristics can be written in a memory description file using the Memory Description Language, said file associating particular memory characteristics with particular memory primitives.

The memory model maker can help to translate port arbitration information for the electronic device into a test framework language before adding the port arbitration information to the memory test model. The memory test model validator can process a gate-level description to produce test patterns and report fault coverage.

The memory primitive represents an irreducible memory structure that is suitable, for example, for at least one of a register transfer-level simulation, a timing analysis, a test generation and a fault simulation. The memory primitive can include at least one of a random access memory primitive, a content addressable memory primitive, and a first-in-first-out memory primitive. In one embodiment, the random access memory primitive is a single port memory primitive having an address decoder, an enable pin, and a bi-directional pin for writing and reading data. In another embodiment, the random access memory primitive is a dual port memory primitive having two address decoders, read and write enable signals, an output enable pin, a read data pin, and a write data pin. In a further embodiment, the content addressable memory primitive has at least one read port, values on a compare data port being compared with a corresponding read port with the result compressed into one bit. In yet a further embodiment, the first-in-first-out memory primitive has read and write addresses that are handled internally.

Also provided herein is a method for automatically generating and validating a memory test model in an electronic device. The method includes inputting memory characteristics for the electronic device, processing said memory characteristics to produce a memory primitive. In addition, the method includes validating the memory primitive, and generating a memory test model for the electronic device from the validated memory primitive.

Also provided herein is a computer-readable medium that stores a program for automatically generating and validating a memory test model for an electronic device. The program includes a memory test model generator for inputting memory characteristics for the electronic device and for outputting a memory primitive, and a memory test model validator for validating the memory primitive for generating a memory test model for the electronic device.

BRIEF DESCRIPTION OF THE DRAWINGS

The aforementioned features and advantages, and other features and aspects of the present invention, will become better understood with regard to the following description and accompanying drawings.

DETAILED DESCRIPTION OF THE INVENTION

Figure 2:
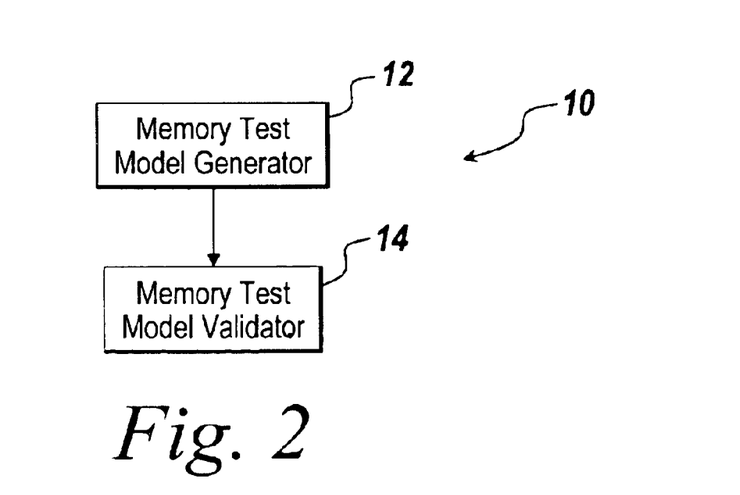
FIG. 2 shows a system for memory test modeling, according to one embodiment of the present invention.

The systems and methods described herein generate and then utilize a white box memory block test model to validate both the RT-level and the transistor-level circuits. A white box approach regards the memory component as an integral part of the design and allows functional patterns to be graded for fault coverage to determine their effectiveness. In addition, a white box approach assists with test generation by allowing the stimulus patterns as well as fault effects to be propagated through the memory blocks. Such desirable characteristics relax the controllability/observability requirements at the boundary of the memory block. To test the memory, the access points closest to the memory boundary are used to launch the test data to the memory block while access points closest to the output boundary of the memory block are used to capture the response of the memory block. During the course of testing the random logic, the signals closest to the input of the memory block captures the response of the random logic in the previous stage and launches stimulus data through the memory block to the capture latches at the next stage of the pipeline FIG. 2 shows a system for memory test modeling 10. The system 10 includes a memory test model generator 12 and a memory test model validator 14. The memory test model generator 12 functions to form a memory test model by first passing a set of user-specified parameters to a memory model maker with the help of a graphical user interface (GUI) and/or a memory description language. The memory model maker of the memory test model generator 12 uses these parameters to generate an RT-level memory primitive model along with a corresponding test generation/fault simulation model. The generated RT-level memory primitive model is instantiated in the memory block RT-level and is used as a building block for the test generation/fault simulation framework. Depending on the complexity of the memory block, correct modeling may require one or more memory primitives along with their associated random logic to be specified. The netlist description of the memory block is created through minimum-effort (i.e., without concern for optimization or timing) high-level synthesis. The netlist description refers to the topological features of the digital design, and includes the random logic and the RT-level memory primitive models. The minimum-effort high-level synthesis refers to the synthesis of a design from a behavioral description to a structural description. In a high-level synthesis, for example, a conditional statement such as "if the signal A is equal to one perform this task" may be compiled into actual gates.

The memory test model validator 14 validates the generated test memory block models to ensure correct functioning with the use of objective automatic test pattern generation (ATPG) patterns and supplemental functional patterns to achieve a given fault coverage. The responses of each of the models to the pattern set are compared, with favorable comparisons indicating that the models behave equivalently under the given set of stimuli.

Figure 3:
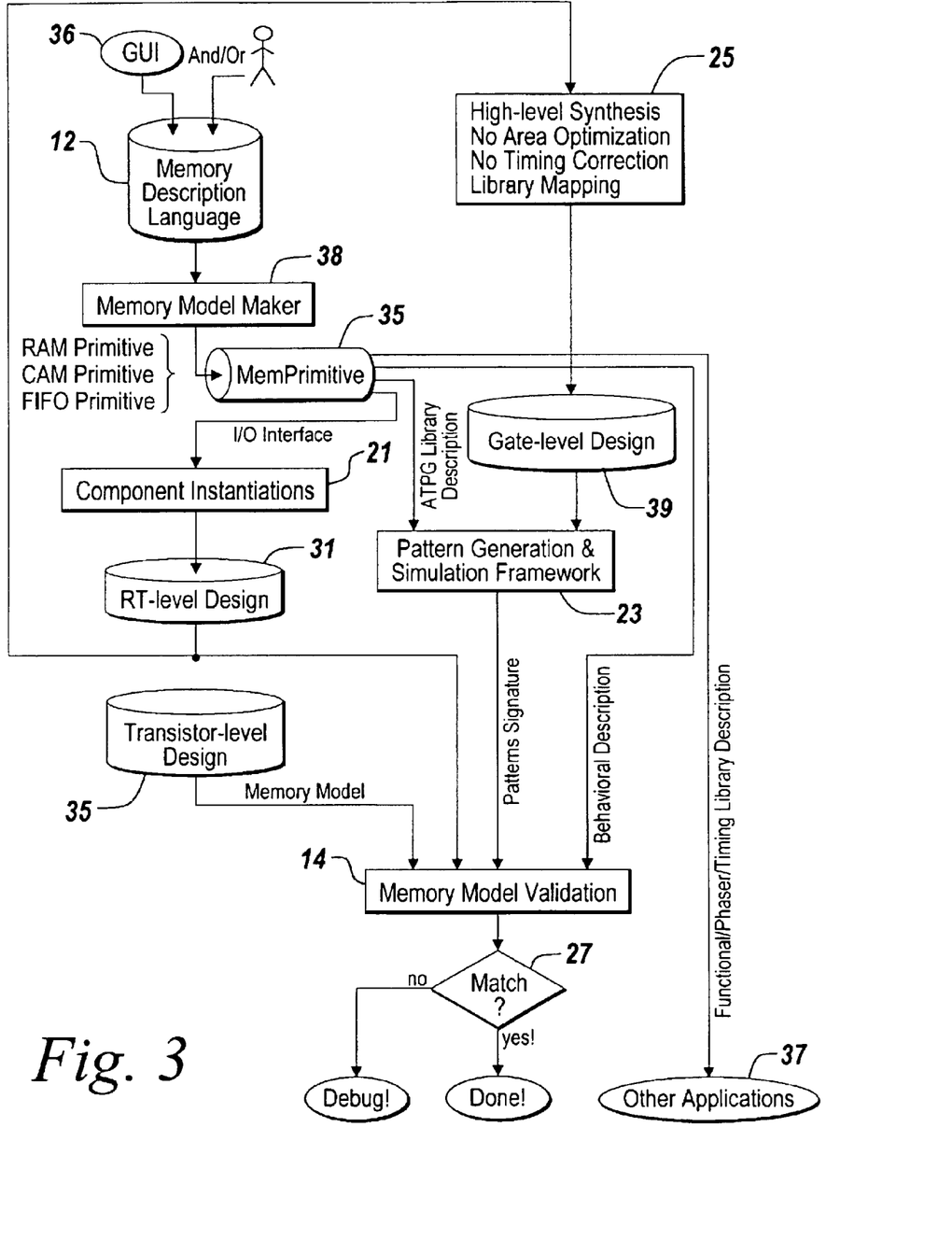
FIG. 3 shows an overview for memory test modeling including the system shown in FIG. 2, according to one embodiment of the present invention.

Referring to FIG. 3, an overview for memory block model processing is shown. The memory test model generator 12 passes a set of user-specified parameters to a memory model maker 38 with the help of a graphical user interface (GUI) 36 and/or a memory description language. The memory model maker 38 of the memory test model generator 12 utilizes these parameters to generate a set of customized memory primitive models 33. The generated RT-level memory primitive model 33 is instantiated in the memory block RT-level 31. The model then goes through high-level synthesis 25 from which the netlist description of the memory block 39 is created. The netlist model of the memory block is loaded in a test generation/fault simulation framework 23 while the test generation/fault simulation memory primitive models 33 are loaded as the description of the instantiated memory primitives.

The memory test model validator 14 validates the generated test memory block models, including the transistor level design 35, to ensure correct functioning with the use of objective ATPG patterns and supplemental functional patterns to achieve a given fault coverage. Fault coverage refers to the ratio between the number of faults a test evaluation detects and the total number of possible faults. A memory test model validator 14, with a larger fault coverage, can catch a larger number of faults than one with a smaller fault coverage. The responses of each of the models to the pattern set are compared in step 27, with favorable comparisons indicating that the models behave equivalently under the given set of stimuli. Other applications 37 may also be considered resulting from a behavioral description, and a functional, phaser, or timing library description.

To achieve these objectives, memory primitives are utilized by the memory test model generator 12. A memory primitive is an atomic memory structure that cannot be decomposed. Memory primitives are scalable (i.e., the numbers of rows and columns associated with the memory primitives may be increased, as well as the number of the read/write ports) and can be customized. Each memory primitive contains 1) a behavioral model that is suitable for RT-level simulation, 2) a structural model that describes the phase accurate model of the memory array and is suitable for timing analysis and 3) a test model that is created for test generation and fault simulation of the entire design. These primitives are represented in code much like a library element or module to be employed as the need arises.

Figure 4A:
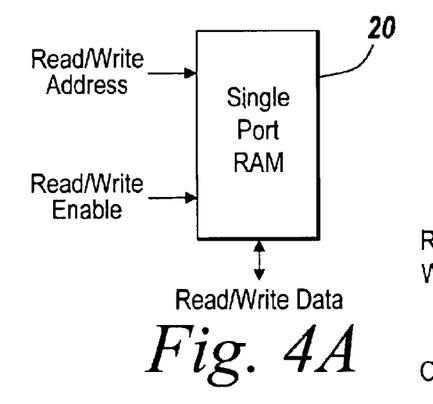
FIGS. 4A–4E show three classes of memory primitives that can be utilized by the system of FIG. 2 to form memory models, according to one embodiment of the present invention.
Figure 4B:
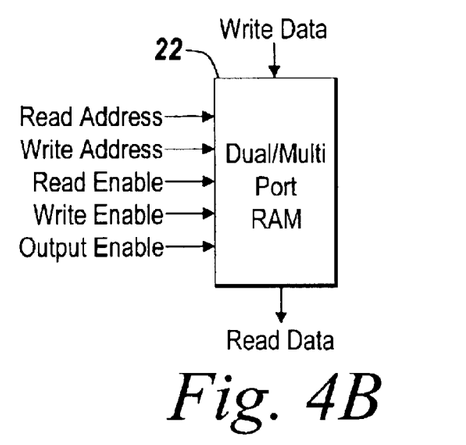
Figure 4C:
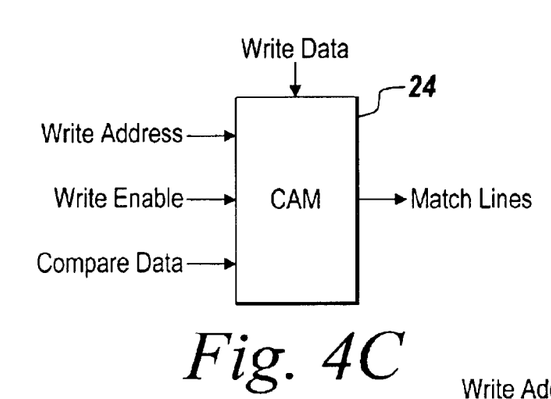
Figure 4D:
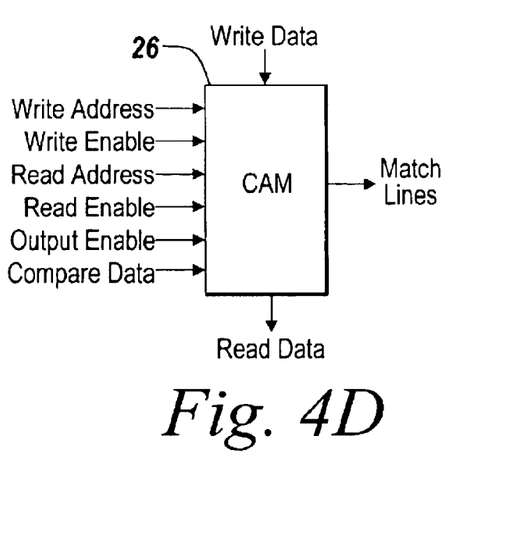
Figure 4E:
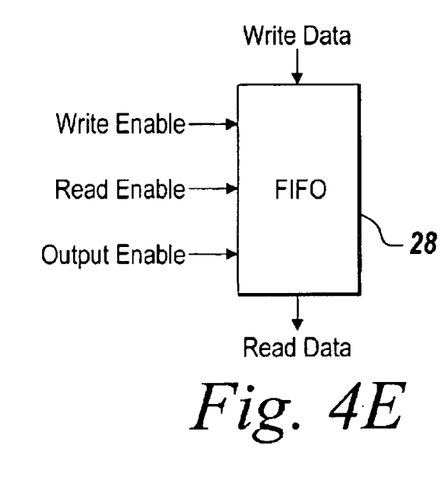

FIGS. 4A–4E show three classes of memory primitives that can be utilized by the memory test model generator 12 to form memory models. In FIGS. 4A and 4B, two types of random access memory (RAM) primitives are shown, a single port RAM primitive 20 and a multi-port RAM primitive 22. In FIGS. 4C and 4D, two types of content addressable memory (CAM) primitives are shown, a non-read data CAM primitive 24 and a read-data CAM primitive 26. In FIG. 4E, a first-in-first-out (FIFO) primitive 28 is shown. These memory primitives can be utilized by the memory test model generator 12 to fully represent memory structures in a microprocessor.

The RAM primitives 20 and 22 are the simplest memory primitives. A RAM primitive can be a single port or multi-port memory primitive. The single port RAM primitive 20 has an address decoder, an enable pin and a bi-directional pin for writing and reading data. The simplest form of a multi-port RAM primitive 22 is a dual-port RAM primitive. This primitive has at least two address decoders (separate read and write addresses), read and write enable signals, an output enable pin that determines the output of the RAM primitive, a read data pin and a write data pin.

The CAM primitives 24 and 26 have a write capability similar to a RAM primitive but with a read operation works on all locations of the RAM primitive. For example, a 5×5 CAM behaves as a RAM with 5 read ports, each of which is 5 bits wide. For each of the read ports, the values on a compare data port are compared with that read port and the results are compressed to one bit, called a match line, so that there is one separate match line for each CAM addressable location. The CAM primitive may also have a normal read capability similar to a dual-port RAM primitive.

The FIFO primitive 28 is also similar to a dual-port RAM primitive; however, the read and write addresses are handled internally. For example, two counters could be feeding the addresses and the RAM primitive and each time the write or the read enable signals are asserted the counters are incremented.

The RAM primitive can be used as a basic building block for the other memory primitives, but with some loss of efficiency. If necessary, however, when all three memory primitives are not available, our approach uses the most appropriate available primitive supported by the test frameworks. For example, suppose a test framework only supports RAM primitives. Then a CAM primitive is built from a RAM primitive with one write port and n read ports where n is the number of words in the memory block. The address decoder of each port is tied to a logic value that allows the read port to read the content of only one unique memory location. By adding an XNOR (exclusive NOR) tree the value of each read port is compared with the compare port. The XNOR tree for each read port is compressed to a 1-bit wide match line by using an AND gate.

Figure 5:
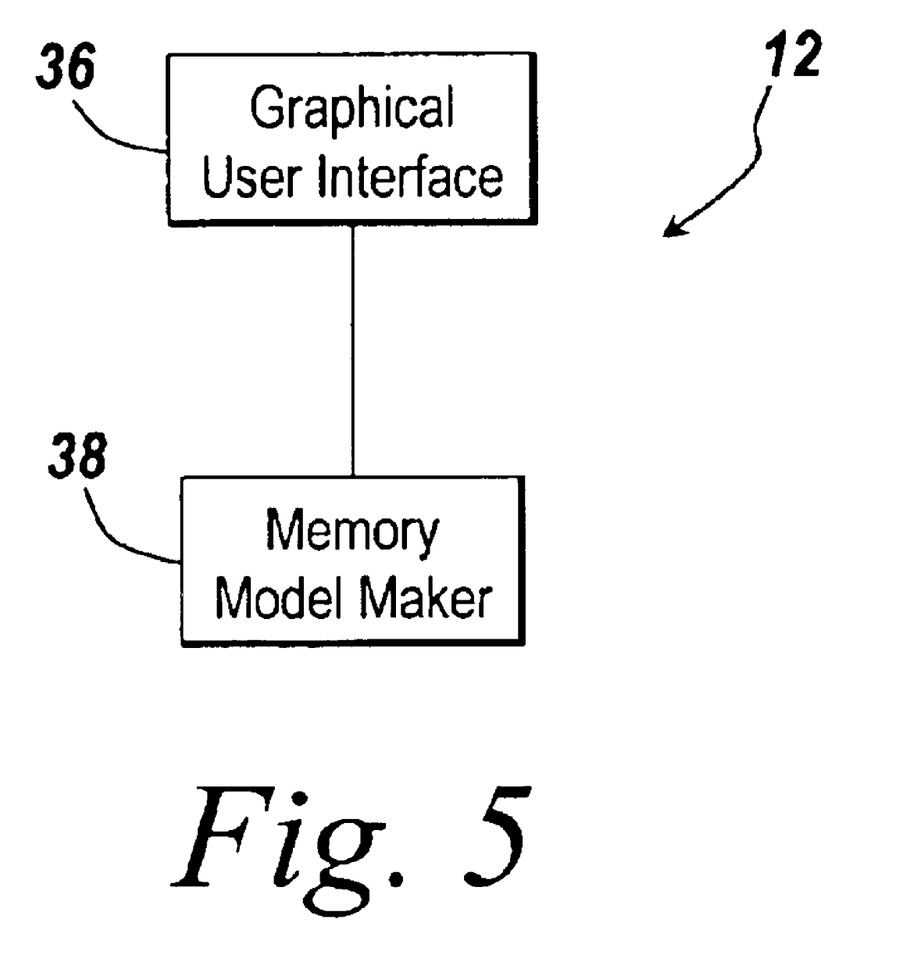
FIG. 5 shows more details of the memory test model generator of FIG. 2, according to one embodiment of the present invention.

Referring to FIG. 5, more details of the memory test model generator 12 of FIG. 2 are shown. The memory test model generator 12 includes a graphical user interface 36 and a memory model maker 38.

The graphical user interface 36 is utilized to pass a set of user-specified parameters to the memory model maker 38. The code to pass these parameters can be written, for example, in a memory description language (MDL). The memory model maker 38 of the memory test model generator 12 uses these parameters to generate an RT-level memory primitive model along with a corresponding test generation/ fault simulation model.

The graphical user interface 36 allows the user to use MDL to describe a memory block in terms of its associated parameters. A user can access the framework via the graphical user interface 36 or by directly creating an MDL file. The graphical user interface 36 also generates an MDL file to allow the memory primitive generation process to be saved and repeated as desired.

The MDL requires the name of the memory primitive and associates the specified information to that memory primitive so that different memory primitives can be described in the same file. One memory primitive description is sufficient for all identical memory primitives in a design.

The memory model maker 38 can be written in a programming language, such as the Perl programming language, and accepts the MDL file as input or it can be invoked via the graphical user interface 36. The memory model maker 38 uses the user specified information to generate a set of customized memory primitives. This could be done by directly generating the memory primitives or by providing a set of generic memory primitives called memory primitive templates. A memory primitive template is a memory primitive that contains variables in the place of hard coded parameters and the places that modification is necessary to create a customized memory primitive are identified. Nevertheless, the first method for realizing a memory model maker requires more programming development with faster run time; however, the second method reduces the complexity as well as enhances the flexibility of the memory model maker. In a memory model maker framework developed using the second method, the framework first selects the best fitting memory primitive template and copies it into the user's directory. Then, the physical characteristics described in the MDL or graphical user interface 36 are used to customize the memory primitive. The addition of any attributes or statements to the memory test model necessary to fully describe the behavior of the memory primitive are added automatically. The port arbitration information is then translated to the test framework language and added to the memory test model.

Figure 6:
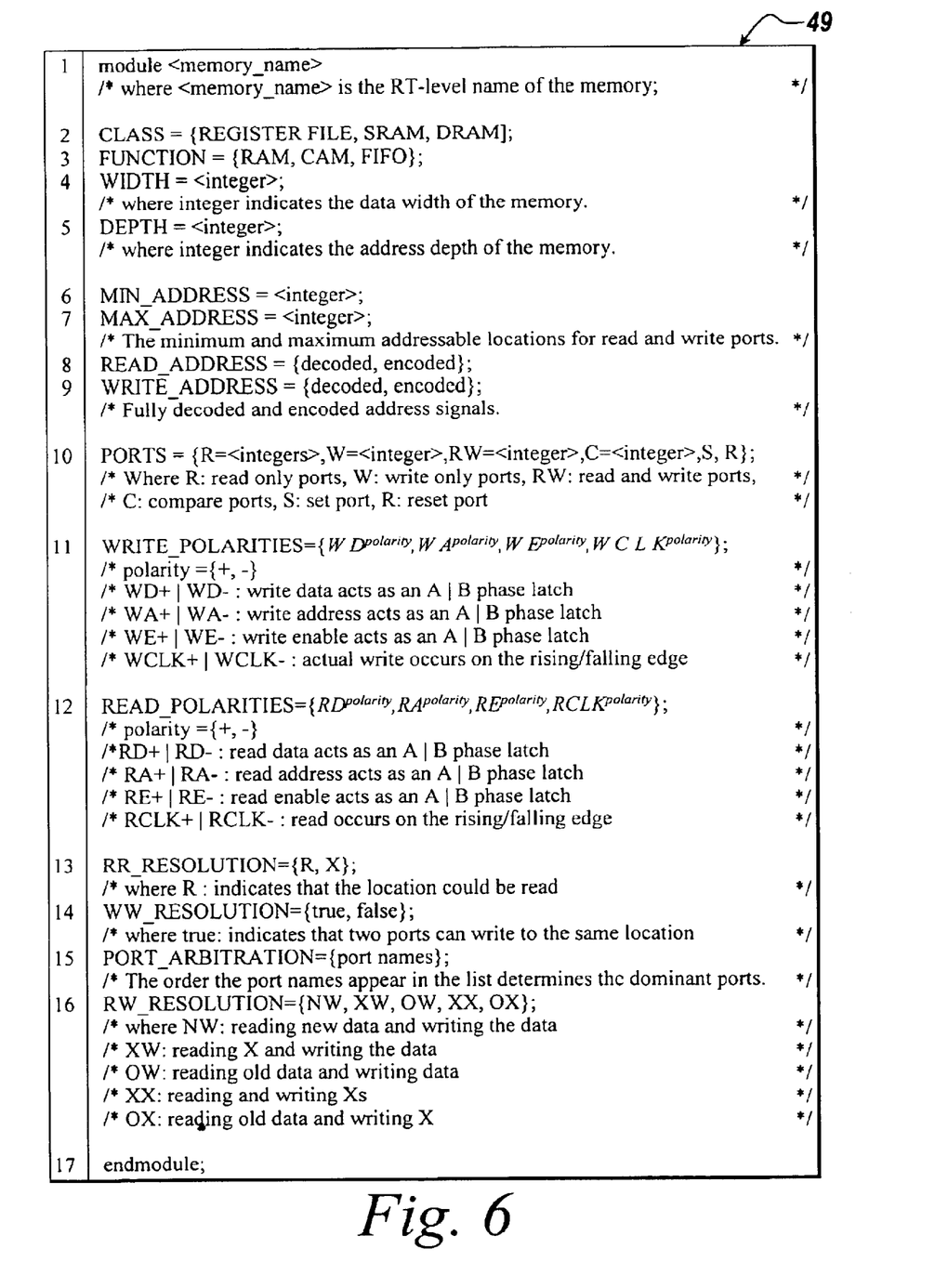
FIG. 6 shows syntax and semantics of a memory description language utilized to form memory models, according to one embodiment of the present invention.

FIG. 6 shows an example that illustrates the syntax and semantics of the MDL 49. The first column is an optional line number and the second column specifies the language syntax. Line number 1 of FIG. 6 allows the user to specify the RT-level name of the memory primitive. In line 2, the class to which the memory primitive belongs is described. A memory primitive can be a register file, an SRAM or a DRAM. The function of the memory primitive, whether a RAM, CAM or FIFO, is specified in line 3. In lines 4 and 5 the data width of the memory primitive and its address depth are described. The minimum addressable and the maximum addressable locations are specified in lines 6 and 7. A memory primitive could have an address decoder or receive already decoded (1-hot) addresses; this information is described in lines 8 and 9 for read and write ports, respectively. The port description of the memory primitive is specified in line 10. Depending on the function of a memory primitive, a memory primitive can have read ports, write ports, read-write (RW) ports, compare ports, set ports, and reset ports. This information allows the proposed framework to generate a memory primitive with the desired number and type of ports. For example, a memory primitive with 4 read, 5 write and 1 read/write port is described as: PORTS={R=4, W=5, RW=1}. The MDL requires at least one port to be of the write-type (set, reset, write) and at least one port to be of the read type (read, compare), unless the memory primitive has at least one RW port as this satisfies both requirements.

Lines 11 and 12, allow the user to specify multi-cycle paths through the memory primitive. A memory primitive can have internal latches to hold the necessary information before the read and write operations. The $Wd^{polarity}$, $Rd^{polarity}$, $WA^{polarity}$, $RA^{polarity}$, $WE^{polarity}$ and $RE^{polarity}$ where polarity={+,−}, describe the write data/read data, write address/read address, write enable/read enable polarities. The WCLK/RCLK represents the write and read clocks. A memory array might not latch any of these values internally and in this case the port polarity is omitted from the list. However, by specifying the polarity of the port, e.g., WD+, RD+, etc., it is established which values are latched and at what clock polarities.

In the case of multi-port memories, the port arbitration of the memory primitive should be described to achieve an accurate and correct model. Line 13 allows a user to describe the outcome of simultaneous read operations of the same memory location. The value R indicates if the read operation is performed successfully and the value X specifies that don't-care values will be at the read ports. Similarly, two write ports can be active and write to the same location simultaneously; this behavior is described in line 14. If WW_RESOLUTION is true then two write ports can write to the same location, otherwise the user would specify false for this statement. For multi-port memories that can write to the same memory location simultaneously, the user has to describe the port arbitration information. The PORT_ARBITRATION statement in line 15 allows the user to describe the list of write ports in their dominance order. For example, the write port in the beginning of the list would be able to write to a memory cell, even though another write port is trying to perform the same operation. In addition, in line 16, the port resolution between read and write ports has to also be specified. A user selects one of the five possible behaviors: a simultaneous read and write to the same location results in reading the new values and writing the data successfully (NW), or reading the old data while successfully writing to the memory cell (OW). Two other options are that the read or the write operation is unsuccessful as specified by XW (reading don't care and successfully writing to the memory cell) or OX (reading successfully and writing don't care to the memory location). The last outcome is that neither read nor write operations are successful (XX).

Figure 7:
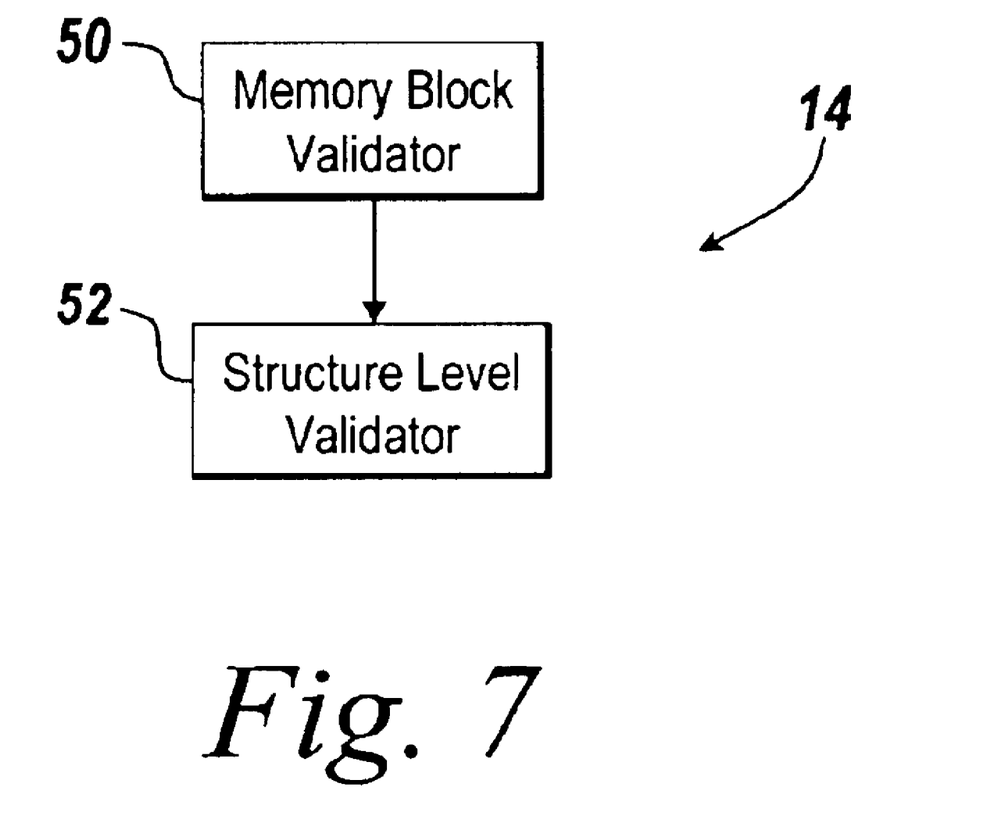
FIG. 7 shows a memory test model validator of FIG. 2, according to one embodiment of the present invention.

Referring to FIG. 7, more details of the memory test model validator 14 shown in FIG. 2 are provided. The memory test model validator 14 includes a memory block validator 50 and a memory structure validator 52.

The memory block validator 50 validates the generated memory block model or view. A memory block model can be an RT-level, a schematic, or a test view. Each of these requires a different validation strategy and process. The memory block validator 50 may validate the RT-level view and the schematic view by using formal verification methods, although this is often not supported by verification tools for memory blocks. More typically, non-formal verification is used between the RT-level and schematic views. The test model is well positioned to use a simulation-based validation method within the test framework using automatic test pattern generation, and any other available patterns.

Once the memory block validation has completed successfully, the memory structure validator 52 validates the memory array and all of its surrounding logic until a controllable/observable point is reached. The memory structure validated by the memory structure validator 52 can thus consist of the entire memory block, or a superset of the memory block.

In custom designs, the netlist of the random logic in the memory structure is created through model abstraction and loaded directly into the test framework while the test model of the memory array is imported by the test tool separately. The memory test algorithm designed to test the memory block, e.g., march C-, is specified using an algorithmic language on the boundary of the memory block. A commercially available component of the test framework, such as MacroTest™ produced by Mentor Graphics, expands the described memory test algorithm into patterns that are loaded via the controllable points and observed at the observable points in the memory structure. These expanded patterns are used as supplemental patterns to the validation patterns.

Supplemental validation patterns are applied to the netlist and the response of the memory structure is saved. A transistor-level simulation similarly applies the supplemental validation patterns and by comparing both responses the correctness of the memory test model is determined. The transistor-level simulation is particularly important to ensure that the dynamic logic in the memory structure generates the correct values in the memory structure test model. One typical occurrence of dynamic logic causing a mismatch in behavior occurs when dynamic logic is interrupted in the memory block or memory structure.

Figure 8:
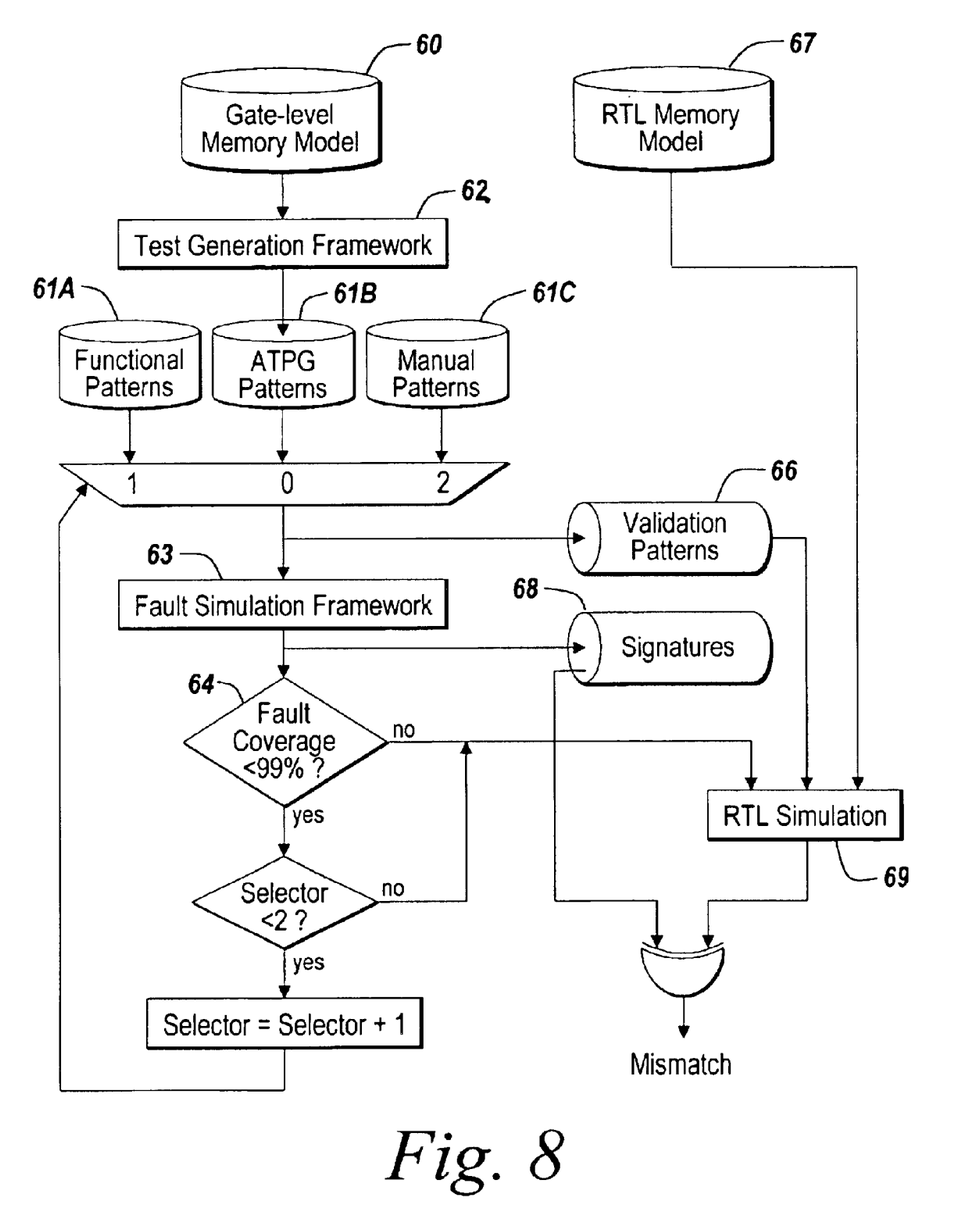
FIG. 8 shows a flow chart detailing the operation of the memory block validator of the memory test model validator of FIG. 6, according to one embodiment of the present invention.

Referring to FIG. 8, a flow chart showing more details of the operation of the memory block validator 50 is provided. In step 60, the gate-level description of the memory block is loaded in the test framework. In step 62, test patterns are generated. In step 64, fault coverage is assessed using a fault simulation framework 63 after inputting ATPG patterns 61A, functional patterns 61B and auxiliary manual patterns 61C. This fault coverage provides a metric to determine the effectiveness of the test patterns. The test generation patterns may be supplemented with functional or manual patterns for the memory block to achieve a fault coverage of 99% or higher. The combinations of patterns used to achieve a specified fault coverage are validation patterns processed in step 66. The response of the memory block test model to the applied validation patterns is saved as a signature in step 68 using the good machine gate-level simulation of the test framework. The response of the RT-level model of the memory block to the validation patterns is also saved and compared to the response of the test model to the same validation patterns. A match indicates that the models compared are equivalent. An RTL memory model 67 contains the behavior of the memory block in the RT-level design to verify the correctness of the overall design. This model can also give rise to a RTL simulation 69 where the behavior of the memory block, regardless of its realization and specific topology, is obtained. By comparing the response of the RTL simulation with the generated memory test models, the correctness of the two models is verified.

While the present invention has been described with reference to illustrative embodiments thereof, those skilled in the art will appreciate that various changes in form and detail may be made without departing from the intended scope of the present invention as defined in the appended claims.

What is claimed:

1. A system for automatically generating and validating a memory test model for an electronic device, the system comprising a memory test model generator for inputting memory characteristics for the electronic device and for outputting a memory primitive; and a memory test model validator for validating the memory primitive for generating a memory test model for the electronic device.

2. The system of claim 1, wherein the memory test model generator includes a graphical user interface for inputting the memory characteristics.

3. The system of claim 1, wherein the memory test model generator includes a memory model maker for selecting a template for the memory primitive and for utilizing the memory characteristics to customize the memory primitive.

4. The system of claim 3, wherein the memory model maker translates port arbitration information for the electronic device into a test framework language before adding the port arbitration information to the memory test model.

5. The system of claim 1, wherein the memory characteristics are input using memory description language.

6. The system of claim 5, wherein a portion of the memory characteristics are written in a memory description file using the Memory Description Language, said file associating particular memory characteristics with particular memory primitives.

7. The system of claim 1, wherein the memory primitive represents an irreducible memory structure that is suitable for at least one of a register transfer-level simulation, a timing analysis, a test generation and a fault simulation.

8. The system of claim 7, wherein the memory primitive includes at least one of a random access memory primitive, a content addressable memory primitive, and a first-in-first-out memory primitive.

9. The system of claim 8, wherein the random access memory primitive is a single port memory primitive having an address decoder, an enable pin, and a bi-directional pin for writing and reading data.

10. The system of claim 8, wherein the random access memory primitive is a dual port memory primitive having two address decoders, read and write enable signals, an output enable pin, a read data pin, and a write data pin.

11. The system of claim 8, wherein the content addressable memory primitive has at least one read port, values on a compare data port being compared with a corresponding read port with the result compressed into one bit.

12. The system of claim 8, wherein the first-in-first-out memory primitive has read and write addresses that are handled internally.

13. The system of claim 1, wherein the memory test model validator processes a gate-level description to produce test patterns and report fault coverage.

14. In an electronic device, a method for automatically generating and validating a memory test model, the method comprising the steps of:
inputting memory characteristics for the electronic device;
processing said memory characteristics to produce a memory primitive;
validating said memory primitive; and
generating a memory test model for the electronic device from the validated memory primitive.

15. The method of claim 14, further comprising the step of:
after the step of inputting, creating a memory description file to store a portion of the memory characteristics, said file written in memory description language.

16. The method of claim 14, wherein, in the step of processing, the memory primitive includes at least one of a random access memory primitive, a content addressable memory primitive, and a first-in-first-out memory primitive.

17. The method of claim 16, wherein, in the step of processing, the memory description file is utilized to form a memory primitive template for producing the memory primitive.

18. The method of claim 14, further comprising the step of selecting a template for the memory primitive and for utilizing the memory characteristics to customize the memory primitive.

19. The method of claim 14, wherein the step of processing includes the step of processing a gate-level description to produce test patterns and report fault coverage.

20. The method of claim 19, wherein the step of processing further includes the step of matching a first response of the test model associated with the test patterns to a second response of a register transfer-level model associated with the test patterns, a close match indicative of the equivalence of the test model and the register transfer-level model to validate the memory primitive.

21. A computer-readable medium that stores a program for automatically generating and validating a memory test model for an electronic device, the program comprising
a memory test model generator for inputting memory characteristics for the electronic device and for outputting a memory primitive; and
a memory test model validator for validating the memory primitive for generating a memory test model for the electronic device.

22. The computer-readable medium of claim 21, wherein the memory test model generator includes a memory model maker for selecting a template for the memory primitive and for utilizing the memory characteristics to customize the memory primitive.

23. The computer-readable medium of claim 21, wherein the memory model maker translates port arbitration information for the electronic device into a test framework language before adding the port arbitration information to the memory test model.

24. The computer-readable medium of claim 21, wherein the memory primitive represents an irreducible memory structure that is suitable for at least one of a register transfer-level simulation, a timing analysis, a test generation and a fault simulation.

25. The computer-readable medium of claim 24, wherein the memory primitive includes at least one of a random access memory primitive, a content addressable memory primitive, and a first-in-first-out memory primitive.

26. The system of claim 25, wherein the random access memory primitive is a single port memory primitive having an address decoder, an enable pin, and a bi-directional pin for writing and reading data.

27. The computer-readable medium of claim 25, wherein the random access memory primitive is a dual port memory primitive having two address decoders, read and write enable signals, an output enable pin, a read data pin, and a write data pin.

28. The computer-readable medium of claim 25, wherein the content addressable memory primitive has at least one read port, values on a compare data port being compared with a corresponding read port with the result compressed into one bit.

* * * * *